United States Patent
Gao et al.

(10) Patent No.: US 9,503,095 B2
(45) Date of Patent: Nov. 22, 2016

(54) SPACE-MULTIPLEXING DRAM-BASED RECONFIGURABLE LOGIC

(71) Applicant: Samsung Electronics Co., Ltd., Suwon-si, Gyeonggi-do (KR)

(72) Inventors: Mingyu Gao, Stanford, CA (US); Hongzhong Zheng, Sunnyvale, CA (US); Krishna T. Malladi, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/838,348

(22) Filed: Aug. 27, 2015

(65) Prior Publication Data

US 2016/0173103 A1    Jun. 16, 2016

Related U.S. Application Data

(60) Provisional application No. 62/092,819, filed on Dec. 16, 2014, provisional application No. 62/092,822, filed on Dec. 16, 2014, provisional application No. 62/092,825, filed on Dec. 16, 2014.

(51) Int. Cl.
*H03K 19/177* (2006.01)
*H01L 25/18* (2006.01)
*H01L 25/00* (2006.01)

(52) U.S. Cl.
CPC ........... *H03K 19/1776* (2013.01); *H01L 25/18* (2013.01); *H01L 25/50* (2013.01); *H03K 19/17728* (2013.01); *H03K 19/17736* (2013.01)

(58) Field of Classification Search
CPC ................. H03K 19/17728; H03K 19/1776
USPC .............................................. 326/39, 40, 46
See application file for complete search history.

(56) References Cited

U.S. PATENT DOCUMENTS

| | | | | |
|---|---|---|---|---|
| 5,594,698 A | * | 1/1997 | Freeman | G11C 7/1006 365/222 |
| 6,020,759 A | * | 2/2000 | Heile | H03K 19/1776 326/37 |
| 7,129,749 B1 | * | 10/2006 | Fenstermaker | H03K 19/17748 326/41 |

* cited by examiner

*Primary Examiner* — Daniel D Chang
(74) *Attorney, Agent, or Firm* — Renaissance IP Law Group LLP

(57) ABSTRACT

According to one general aspect, an apparatus may include a random access memory array that, in turn, includes a reconfigurable look-up table. The reconfigurable look-up table may include memory cells configured to simultaneously store a plurality of look-up tables, wherein each look-up table is associated with a respective logic function. The reconfigurable look-up table may include a local row decoder configured to activate one or more rows of memory cells based upon a set of input signals. The reconfigurable look-up table may be configured to perform one logic function at a time, and wherein the logic function is dynamically selected. The plurality of look up tables stored in the memory cells may be configured to be dynamically altered via a write operation to the random access memory array.

20 Claims, 7 Drawing Sheets

200

300

301

303

Figure 1:
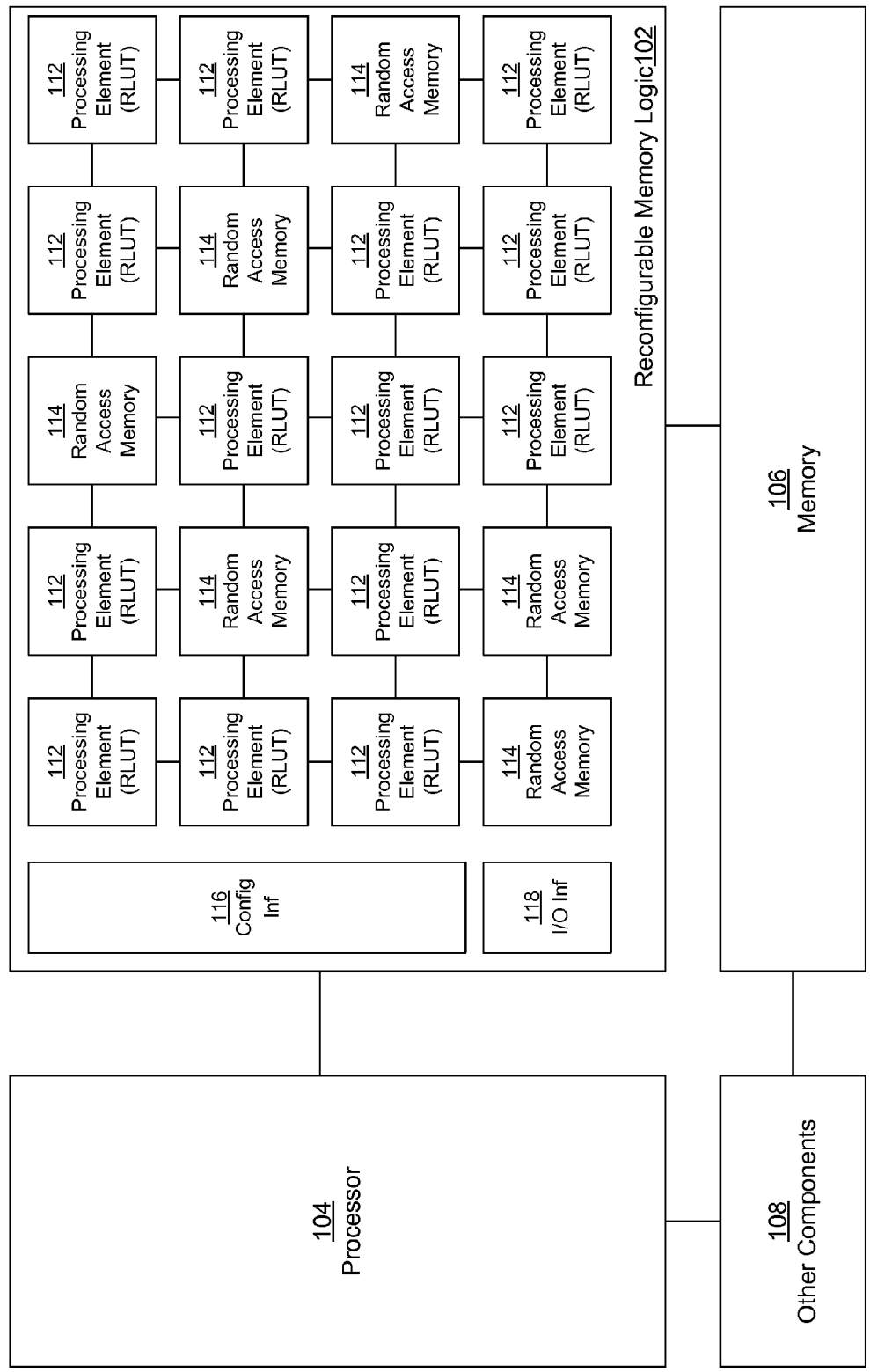

SPACE-MULTIPLEXING DRAM-BASED RECONFIGURABLE LOGIC

CROSS-REFERENCE TO RELATED APPLICATION

This application claims priority under 35 U.S.C. §119 to Provisional Patent Application Ser. No. 62/092,819, entitled "DRAM-BASED RECONFIGURABLE LOGIC" filed on Dec. 16, 2014. The subject matter of this earlier filed application is hereby incorporated by reference.

This application claims priority under 35 U.S.C. §119 to Provisional Patent Application Ser. No. 62/092,822, entitled "HBM WITH DRAM-BASED RECONFIGURABLE LOGIC ARCHITECTURE" filed on Dec. 16, 2014. The subject matter of this earlier filed application is hereby incorporated by reference.

This application claims priority under 35 U.S.C. §119 to Provisional Patent Application Ser. No. 62/092,825, entitled "SPACE-MULTIPLEXING DRAM-BASED RECONFIGURABLE LOGIC" filed on Dec. 16, 2014. The subject matter of this earlier filed application is hereby incorporated by reference.

TECHNICAL FIELD

This description relates to computing technology, and more specifically to reconfigurable processing units.

BACKGROUND

Generally, a programmable logic device (PLD) is an electronic component used to build reconfigurable digital circuits. Unlike a logic gate or logic circuit, which generally has a fixed function, a PLD traditionally has an undefined function at the time of manufacture. Often, before the PLD can be used in a circuit it must be programmed, that is, reconfigured to perform a desired function.

Traditionally a PLD may include a combination of a logic device and a memory device. Generally, the memory is used to store a pattern that was given to the chip during programming. Most of the methods for storing data in an integrated circuit have been adapted for use in PLDs. These generally include silicon anti-fuses, static random access memory (SRAM), erasable programmable read only memory (EPROM), electronically EPROM (EEPROM), non-volatile RAM, etc. In general, most PLDs include components that are programmed by applying an unusual level of voltage across a modified area of silicon inside the chip. This high level of voltage breaks or sets (depending on the technology) electrical connections and changes the layout of the electrical circuit.

One of the most common types of PLDs is a field-programmable gate array (FPGA). A FPGA is an integrated circuit designed to be configured by a customer or a designer after manufacturing—hence "field-programmable". The FPGA configuration is generally specified using a hardware description language (HDL), similar to that used for an application-specific integrated circuit (ASIC).

FPGAs include an array of programmable logic blocks, and a hierarchy of reconfigurable interconnects that allow the blocks to be "wired together". A FPGA's logic blocks can be configured to perform complex combinational functions, or merely simple logic gates like AND, XOR, etc.

SUMMARY

According to one general aspect, an apparatus may include a random access memory array that, in turn, includes a reconfigurable look-up table. The reconfigurable look-up table may include memory cells configured to simultaneously store a plurality of look-up tables, wherein each look-up table is associated with a respective logic function. The reconfigurable look-up table may include a local row decoder configured to activate one or more rows of memory cells based upon a set of input signals. The reconfigurable look-up table may be configured to perform one logic function at a time, and wherein the logic function is dynamically selected. The plurality of look up tables stored in the memory cells may be configured to be dynamically altered via a write operation to the random access memory array.

According to another general aspect, a system-on-a-chip may include a processor and a random access memory array. The random access memory array may include a reconfigurable look-up table. The reconfigurable look-up table may include memory cells configured to simultaneously store a plurality of look-up tables, wherein each look-up table is associated with a respective logic function, and a logic function selector configured to dynamically select one the of plurality of look-up tables to be active. The reconfigurable look-up table may be configured to perform the selected logic function. The processor may be configured to off-load an execution of at least the selected logic function to the reconfigurable look-up table.

According to another general aspect, a method may include storing a plurality of look-up tables in a sub-array of a reconfigurable look-up table of a dynamic random access memory array. The method may also include dynamically multiplexing between at least a sub-set of the plurality of look-up tables to perform a plurality of logic functions, without altering the plurality of look-up tables stored in the reconfigurable look-up table.

The details of one or more implementations are set forth in the accompanying drawings and the description below. Other features will be apparent from the description and drawings, and from the claims.

A system and/or method for computing technology, and more specifically to reconfigurable processing units, substantially as shown in and/or described in connection with at least one of the figures, as set forth more completely in the claims.

BRIEF DESCRIPTION OF THE DRAWINGS

FIG. 1 is a block diagram of an example embodiment of a system in accordance with the disclosed subject matter.

FIG. 2 is a block diagram of an example embodiment of an apparatus in accordance with the disclosed subject matter.

FIG. 3*a* is a block diagram of an example embodiment of an apparatus in accordance with the disclosed subject matter.

FIG. 3*b* is a block diagram of an example embodiment of an apparatus in accordance with the disclosed subject matter.

FIG. 3*c* is a timing diagram of an example embodiment of an apparatus in accordance with the disclosed subject matter.

FIG. 4 is a block diagram of an example embodiment of a system in accordance with the disclosed subject matter.

FIG. 5 is a schematic block diagram of an information processing system that may include devices formed according to principles of the disclosed subject matter.

Like reference symbols in the various drawings indicate like elements.

DETAILED DESCRIPTION

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system 100 in accordance with the disclosed subject matter. In various embodiments, the system 100 may include a processor 104, a memory 106, and a reconfigurable memory logic 102. In various embodiments, the system 108 may also include one or more other components 108 (e.g., a network interface, a memory controller, etc.).

In various embodiments, the system 100 may include a system on a chip (SoC). In another embodiment, the system 10 may include a series of discrete or individual components. In yet another embodiment, the system 100 may include a combination of integrated and discrete components. In various embodiments, the system 100 may include a computing device, such as, for example, a laptop, desktop, workstation, personal digital assistant, smartphone, tablet, and other appropriate computers, etc. or a virtual machine or virtual computing device thereof. In various embodiments, the system 100 may be used by a user (not shown).

In the illustrated embodiment, the processor 104 may be configured to execute one or more machine executable instructions or pieces of software, firmware, or a combination thereof. In such an embodiment, the processor 104 may include fixed logic circuits (e.g., AND gates, flip-flops, etc.) that are set during the manufacture of the processor 104 (or shortly thereafter, e.g., fuses, etc.) and may not be substantially changed after manufacture.

In various embodiments, the memory 106 may include a plurality of memory cells each configured to store one or more pieces of data, either temporarily, permanently, semi-permanently, or a combination thereof. The data in the memory 106 may be accessed by the processor 104. Further, the memory 106 may include volatile memory, non-volatile memory or a combination thereof.

In the illustrated embodiment, the system 100 may include a reconfigurable memory logic 102. The reconfigurable memory logic 102 may be similar to the memory 106 in that they may both include a number of memory cells (not explicitly shown) that are arranged in sub-arrays (illustrated as elements 112 and 114). Typically, a memory (e.g., an SRAM, a dynamic RAM (DRAM), etc.) includes an array of memory cells arranged into an array of rows and columns. Often, in order to make the larger array more manageable, the array may be divided into sub-arrays of memory cells (e.g., 256 rows by 256 columns, etc.). Traditionally, division of a memory array into sub-arrays may be advantageous because generally only one sub-array is accessed at a time, thus reducing power and computation complexity.

In the illustrated embodiment, the memory array (illustrated by the reconfigurable memory logic 102) may differ from the memory 106 in that the sub-arrays may be reconfigured to act as look-up tables (LUTs) instead of traditional memory sub-arrays. In such an embodiment, a logic function may be implemented in a LUT. For example, the LUT may perform an arithmetic logic function, such as that of an adder, multiplier, etc. It is understood that the above is merely one illustrative example to which the disclosed subject matter is not limited. In the illustrated embodiment, such LUTs may be referred to as processing elements or reconfigurable LUTs (RLUTs) 112.

In such an embodiment, a RLUT 112 and the logic function implemented therein may be altered by merely performing a memory write operation. This may allow logic functions to be reconfigured or altered dynamically during the operation of the system 100. The use of a traditional write operation (or similar) may allow for reprogramming without the need of an unusual (i.e., non-operational or high) voltage, such as those used for programming EEPROMs, etc.

In such an embodiment, the reconfigurable memory logic 102 may include a configuration interface 116. In various embodiments, when the processor 104 (or other component) wishes to change or alter the logic function stored in the RLUT 112, it may perform a write operation or a special write operation (e.g., a write operation that includes an indicator that it involves a RLUT 112, etc.).

In some embodiments, all memory accesses or operations may pass through the reconfigurable memory logic 102's input/output (I/O) interface 118. In such an embodiment, if the memory access is to a sub-array that stores data for revival (e.g., a RAM sub-array 114, etc.), the I/O interface 118 may simply process the read/write request as a memory array traditionally would. However, in some embodiments, if the memory access is to a sub-array that is employed as a RLUT 112 (or will be employed as a RLUT 112), the I/O interface 118 may pass that memory access to the configuration interface 116 for processing.

In yet another embodiment, the I/O interface 118 may be configured to read or write to the RLUT 112. In such an embodiment, the write access may involve writing to the RLUT 112 to define the logical function thereof. In such an embodiment, the configuration interface 116 may be configured to adjust the routing of signals within the RLUT 112 or the reconfigurable memory logic 102 as a whole. For example, the configuration interface 116 may be configured to adjust the routing of signals between multiple RLUT 112 and/or the RAM 114s. In such an embodiment, the I/O interface 118 may be configured to manage data access to the RLUT 112s and RAMs 114, and the configuration interface 116 may be configured to manage the interconnects and routing of the sub-arrays 112 & 114. It is understood that the above are merely a few illustrative examples to which the disclosed subject matter is not limited. In various embodiments, the I/O interface 118 may include the configuration interface 116.

Further, in the illustrated embodiment, each sub-array may be utilized as either a RLUT 112 or as a traditional RAM 114 memory sub-array. As described above, a traditional RAM 114 sub-array may be configured to store data and information. In such an embodiment, the number of or balance between RLUTs 112 and RAM subarrays 114 may be dynamically adjusted within the reconfigurable memory logic 102 as desired. In another embodiment, the number of RLUTs 112 and RAM sub-arrays 114 may be fixed during manufacture. In yet another embodiment, a maximum number of RLUTs 112 may be fixed during manufacture but the RLUTs 112 may be configurable to operate as RAM sub-arrays 114. It is understood that the above are merely a few illustrative examples to which the disclosed subject matter is not limited.

In various embodiments, the processor 104 (or other component) may wish to configure a sub-array as a RLUT 112. In such an embodiment, the processor 104 may make a memory access to the reconfigurable memory logic 102. The memory access may include a write operation that stores a look-up table in a particular RLUT 112. The memory access may include a series of memory accesses depending upon the size of the LUT. In some embodiments, particular memory accesses may indicate the number of inputs to the LUT and the number of outputs from the LUT. In addition, further memory accesses may indicate signal routing information regarding the RLUT 112. For example, as described below, multiple RLUTs 112 may be cascaded or otherwise routed together to perform logical functions (e.g., an adder, etc.).

Conversely, the processor 104 (or other component) may wish to configure a sub-array as a RAM 114. In which case, the memory accesses may instruct the configuration interface 116 to re-configure the RLUT 112 back to a standard RAM 114. In some embodiments, a predefined memory cell may be configured to store a bit that indicates whether or not the sub-array is currently functioning as a RLUT 112 or a RAM 114. In various embodiments, that indication bit may be included in the sub-array or the configuration interface 116. It is understood that the above are merely a few illustrative examples to which the disclosed subject matter is not limited.

In various embodiments, the reconfigurable memory logic 102 may include dynamic RAM (DRAM). This may differ from the traditional FPGA or PLD technology in that the RLUT 112s may be reprogrammed by normal memory access operations and without the need to resort to special voltages (e.g., to burn fuses, or set transistors, etc.).

In such an embodiment, by basing the RLUTs 112 on DRAM subarrays a higher density may be archived, compared to an SRAM-based FPGA. For example, the DRAM RLUT 112 may require only one transistor and one capacitor (1T1C) per memory cell or bit of information, compared to the SRAM's need for six transistors (6T). In another embodiment, the DRAM RLUT 112s may result in a lower cost compared to SRAM or Flash-based FPGAs.

As the RLUT 112 may be modified by a traditional memory access (or a variant thereof), the RLUT 112 may be self-modifying. For example, the outputs of one clock-cycle's RLUT 112 computation may result in a memory access that re-configures or updates the RLUT 112 to perform a second computational function. In another embodiment, the outputs of a RLUT 112 may be feedback as inputs to the same RLUT 112 in a way that modifies the RLUT 112's behavior.

In addition, in various embodiments, the co-mingling of the DRAM RLUTs 112 and RAMs 114 may provide advantages. For example, the close proximity to the data stored in the RAM 114, may speed the computation performed by the RLUT 112, and lower the power requirements as data need not be moved across busses. In some embodiments, by basing the RLUT 112 upon DRAM-technology similar to that used to create the processor 104 and memory 106, the RLUT 112s may exist within the same die or package as the processor 104 and/or memory 106. As such, the near-data computing provided by the DRAM RLUT 112s may be faster and more efficient. In addition, the same manufacturing process may lower the cost of the production of system 100. It is understood that the above are merely a few illustrative examples to which the disclosed subject matter is not limited.

Figure 2:
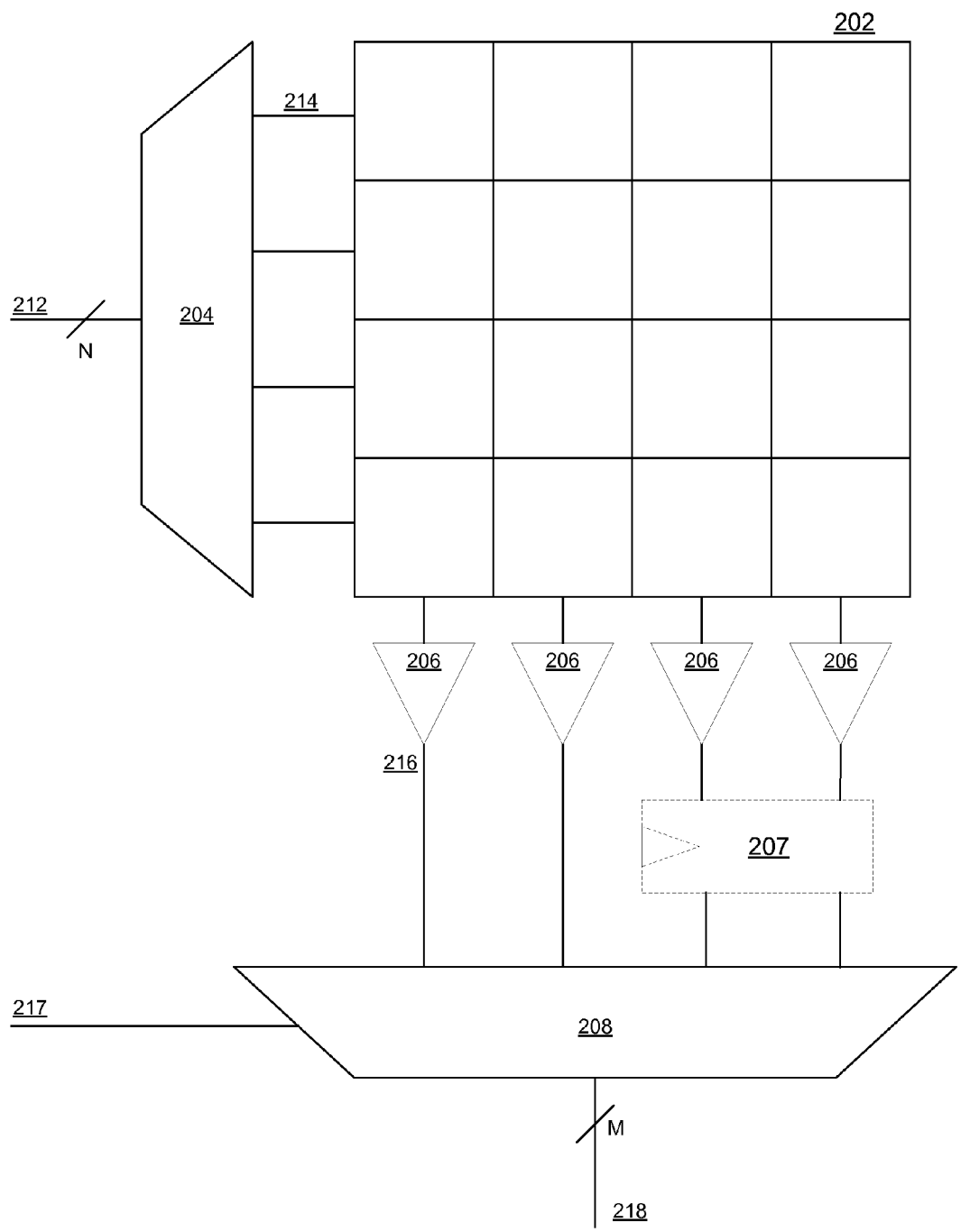

FIG. 2 is a block diagram of an example embodiment of an apparatus or RLUT 200 in accordance with the disclosed subject matter. In the illustrated embodiment, the RLUT 200 may include a sub-array or plurality of memory cells 202 configured to store data. In the illustrated embodiment, the memory cells 202 may store a look-up table that performs a logic function (e.g., a 4-bit adder, etc.).

In various embodiments, the RLUT 200 may receive N signals as inputs 212. In various embodiments, the N input signals 212 may be divided into groups based upon operands of the RLUT 200's logic function. For example, if the input signals 212 include 8-bits, they may be grouped into two 4-bit operands. It is understood that the above is merely one illustrative example to which the disclosed subject matter is not limited.

The inputs 212 may be decoded by a local row decoder 204. In various embodiments, the local row decoder 204 may be configured to activate one or more rows 214 of memory cells 202 based upon the values of the input signals 212. In various embodiments, the local row decoder 204 may use the input signals' 212 values as an address to a row of the memory cells 202.

In the illustrated embodiment, each column of the memory cells 202 may be coupled with a driver 206 configured to output, at a predefined voltage, the values stored in the selected row. In various embodiments, the driver 206 may include a word line driver.

In some embodiments, the RLUT 200 may include one or more registers 207 configured to store output signals of the RLUT 200. For example, in some embodiments, the RLUT 200 may be part of a pipelined architecture in which inputs and/or outputs are generally expected to be stable between the edges of a clock signal. In such an embodiment, the registers 207 may be employed to stabilize or hold the output signal 218 values as required by the pipeline architecture. In the illustrated embodiment, the register 207 is shown between the driver 206 and the local line selector 208. In another embodiment, the register 207 may be placed after the local line selector 208. It is understood that the above is merely one illustrative example to which the disclosed subject matter is not limited.

In some embodiments, the RLUT 200 may include a local line selector 208 configured to select a sub-set 216 of the row of memory cells 202 based upon at least one input signal 217. In such an embodiment, the local line selector 208 may generate the final output signal 218. In the illustrated embodiment, the output signal 218 may include M-bits.

In some embodiments, the value of the input signal 217 may dynamically change. For example, in the case of an adder, the input signal 217 may function as a carry-in bit, and change with each new addition operation. In another embodiment, the input signal 217 may be a relatively consistent value. For example, the RLUT 200 may have word lines of 16 bits, but the desired output signals 218 may only include 5 bits. In such an embodiment, the input signal 217 may be configured to select only the first 5-bits of the 16-bit word. It is understood that the above are merely a few illustrative examples to which the disclosed subject matter is not limited.

In various embodiments, it may be advantageous for the DRAM-based RLUT 200 to be limited to a minimum number of inputs 212 and a minimum number of outputs 218. For example, if the memory cells 202 include an entire sub-array, the number of rows and columns may be relatively large. As such, it may be more efficient to employ a LUT that makes use of most of the sub-array's rows (e.g., input signals 212) and most of the sub-array's columns (e.g., output signals 218). In such an embodiment, a predefined minimum number of inputs/outputs may result in a minimum amount of efficient utilization of the sub-array.

In various embodiments, the utilization of the sub-array may lend the RLUT 200 to arithmetic computing functions (e.g., an adder, etc.) that include a relatively large number of inputs/outputs. Conversely, while the RLUT 200 may be employed for computing functions with a small number of inputs/outputs (e.g., random control logic, etc.) this may not be the most efficient use of the RLUT 200. It is understood that the above is merely one illustrative example to which the disclosed subject matter is not limited.

In one example embodiment, the RLUT 200 may be configured to include a minimum operand width of 4-bits. In such an embodiment, a two operand logic function may include a total input signal 212 width of 8-bits. Likewise, the RLUT 200 may be configured to include a minimum output signal 218 width of 9-bits. In another embodiment, the RLUT 200 may be configured to include a minimum output signal 218 width equal to two times the minimum operand width (e.g., 8-bits, etc.). It is understood that the above is merely one illustrative example to which the disclosed subject matter is not limited.

In various embodiments, the RLUT 200 may be configured such that the number of input signals 212 and/or output signals 218 may be dynamically altered. For example, as the logic function performed by the RLUT 200 is dynamically altered from a first function to a second function, the number of input signals 212, number of operands, and/or number of output signals 218 may also be dynamically altered. In such an embodiment, this alteration may involve selecting a subset of the total possible number of signals 212 and/or 218 as active.

Figure 3A:
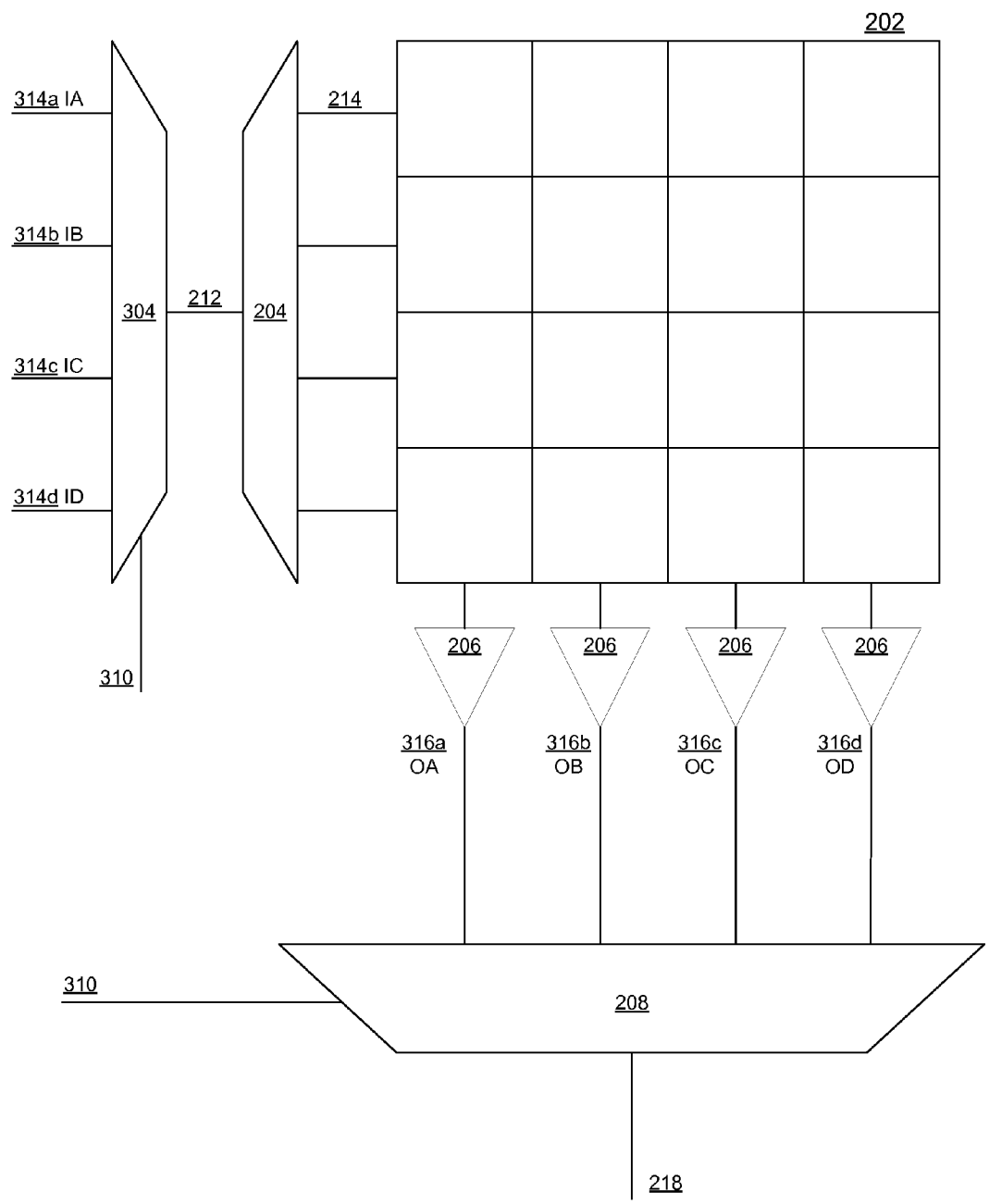

FIG. 3a is a block diagram of an example embodiment of an apparatus or RLUT 300 in accordance with the disclosed subject matter. In the illustrated embodiment, a RLUT or enhanced sub-array (ESA) may be multiplexed in order to provide a number of logical functions while only using a single sub-array. In such an embodiment, the efficiency of the RLUTs may be increased.

As described above, in various embodiments, the apparatus or RLUT 300 may include a plurality of or a sub-array of memory cells 202, a local row decoder 204, a local line selector or output selector 208, and a number of drivers 206. As described above, a look-up table that performs a logic function may be stored in the memory cells 202. Inputs 212 may be applied to the RLUT 300. The local row decoder 204 may select or energize a particular row 214, based upon the inputs 212. This may cause the LUT in the memory cells 202 to output values, some or all of which are selected by the local line selector 208 to be final output 218.

However, in the illustrated embodiment, the RLUT 300 may store a plurality of LUTs (e.g., four, etc.) each associated with different logical functions. As described above, the size of a typical sub-array may lend its use to large LUTs with a relatively large number of inputs and outputs. In various embodiments, by storing multiple LUTs in a single sub-array and dynamically multiplexing between them, it may be more efficient to make use of smaller LUTs.

In the illustrated embodiment, four LUTs or logic functions (e.g., A, B, C, and D, etc.) may be simultaneously stored in the RLUT 300. In this example, each LUT may consume a quarter of the sub-array 202's capacity and may include the same number of input signals and output signals. However, in another embodiment, each LUT may be associated with a different amount of storage space, number of input signals, and/or number of output signals. In various embodiments, the LUTs, taken in the aggregate, may consume all of the sub-array 202's space or may only consume a portion thereof. In yet another embodiment, memory access operations to the sub-array 202 may over-write, replace, or remove one LUT, a sub-set of the LUTs, or all of the LUTs. It is understood that the above are merely a few illustrative examples to which the disclosed subject matter is not limited.

In the illustrated embodiment, the inputs to the various logic functions A, B, C, and D may be provide by the input signals 314a, 314b, 314c, and 314d, respectively. The input or logic selection signal 310 may select which of the four logic function are active at any given moment. In the illustrated embodiment, this is shown by input decoder or multiplexer 304 selecting a logic function input (e.g., 314a, 314b, etc.) or a subset of the total input signals to be active as the LUT input signal 212. It is understood that the above is merely one illustrative example to which the disclosed subject matter is not limited.

Likewise, the LUT 300 may output four logic function output signals 316a, 316b, 316c, 316d, one for each logic function A, B, C, and D, respectively. In such an embodiment, the multiplexer 208 may select which of the logic function output signals is to be ultimately output from the RLUT 300 as the output signal 218. In such an embodiment, the logic selection signal 310 may select the desired output signal. In some embodiments, a second or hierarchy of output multiplexers (not shown) may be employed, similarly to the input multiplexer 304/local row decoder 204 combination discussed above. It is understood that the above are merely a few illustrative examples to which the disclosed subject matter is not limited.

In various embodiments, the logic section signal 310 may be changed once a clock cycle, such that during each clock tick a particular logic function A, B, C, or D, is selected. In such an embodiment, the active logic function associated with the RLUT 300 may be dynamically selected. In various embodiments, the selected logic function may be relatively static for long periods of time. In another embodiment, a predetermined rotation pattern may be employed. In yet another embodiment, the selected logic function may change based upon the computation instruction that is to be executed. It is understood that the above are merely a few illustrative examples to which the disclosed subject matter is not limited.

Figure 3B:
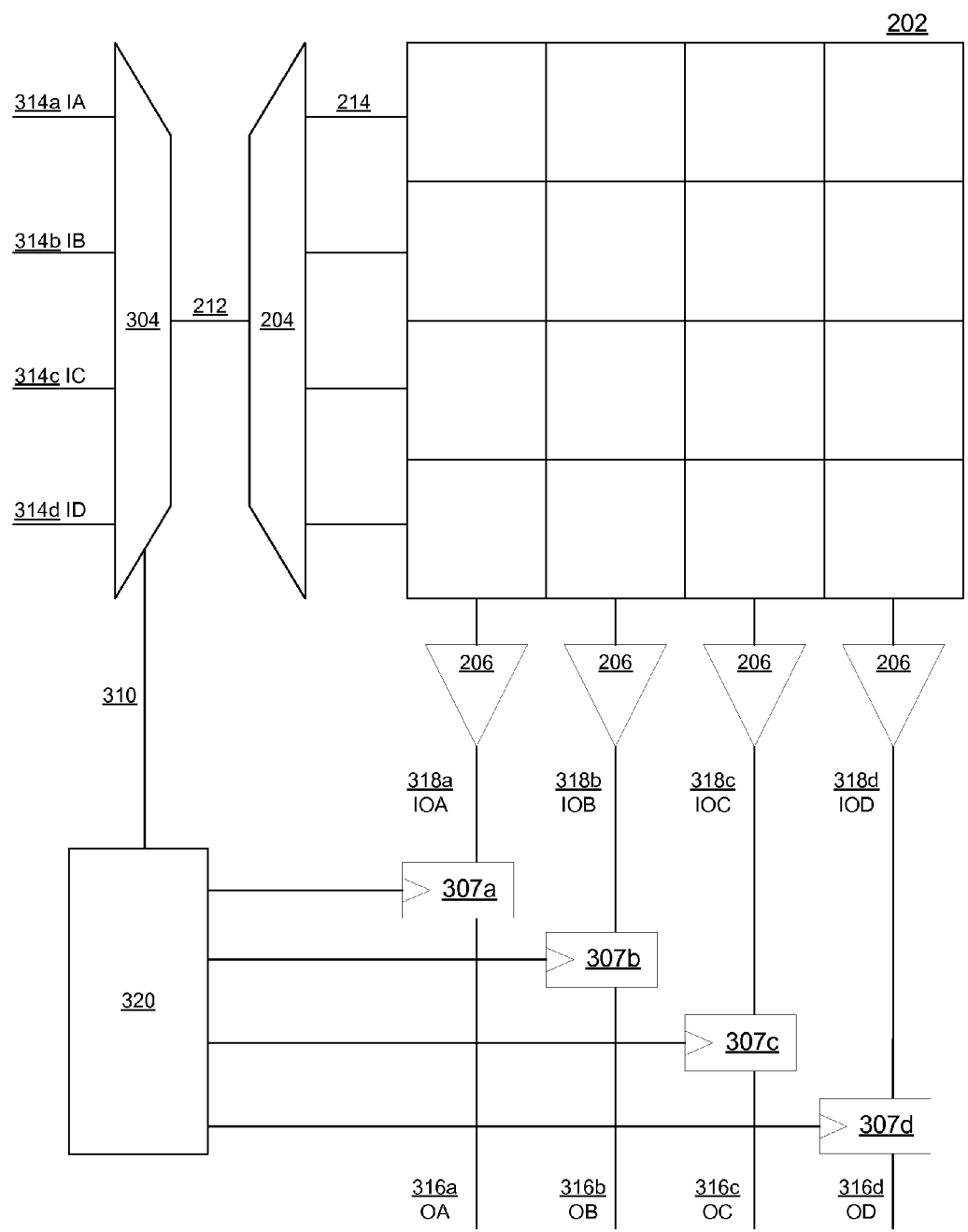

FIG. 3b is a block diagram of an example embodiment of an apparatus or RLUT 301 in accordance with the disclosed subject matter. In the illustrated embodiment, a RLUT or enhanced sub-array (ESA) may be time-division multiplexed in order to provide a number of logical functions while only using a single sub-array. In such an embodiment, the efficiency and usefulness of the RLUT may be increased.

As described above, in various embodiments, the apparatus or RLUT 301 may include a plurality or a sub-array of memory cells 202, a local row decoder 204, a multiplexer 304, and a number of drivers 206. As described above, a look-up table that performs a logic function may be stored in the memory cells 202. Inputs 212 may be applied to the RLUT 301. The local row decoder 204 may select or energize a particular row 214, based upon the inputs 212. This may cause the LUT in the memory cells 202 to output values.

In various embodiments, the RLUT 301 may receive input signals for all (or a subset) of the possible logic functions (e.g., logic functions A, B, C, and D, etc.) at substantially the same time (e.g., the rising clock edge, etc.). However, unlike the embodiment shown in FIG. 3a (RLUT 300) in which a single logic function was processed per clock cycle, the RLUT 301 of this embodiment may be configured to effectively process all four logic functions during a single clock cycle. In the illustrated embodiment, it may accomplish this via time multiplexing.

In the illustrated embodiment, the RLUT 301 may include both an external clock and an internal clock. In one embodiment, the external clock (shown in FIG. 3c) may be the system clock and determine the rate at which the inputs 314a, 314b, 314c, and 314d are presented, and the outputs 316a, 316b, 316c, and 316d are read. The internal clock (shown in FIG. 3c) may be a clock signal used only by the RLUT 301 (or components similar to the RLUT 301) and may determine the rate at which the internal input signal 212 is processed. In various embodiments, the internal clock signal may run at a multiple of the external clock signal (e.g., at 4 times the speed, etc.).

In the illustrated embodiment, the logic function inputs 314a, 314b, 314c, 314d, etc. may be presented or change at the frequency of the external clock. In one embodiment, a series of flip-flops or other memories (not shown) may latch or store the logic function inputs 314a, 314b, 314c, 314d, etc. based upon the external clock.

The selection signal 310 may be configured to select one of the logic function inputs 314a, etc. each tick of the internal clock. In the illustrated embodiment, the internal clock may be four times faster than the external clock. Therefore, each of the four logic functions A, B, C, and D may be selected as active for a quarter of the external clock period. When active they may be passed (via the multiplexer 304) to the internal input signal 212. It is understood that the above is merely one illustrative example to which the disclosed subject matter is not limited.

During that period in which a logic function is selected, the RLUT 301 may process the inputs and generate the appropriate output signals. Therefore, as the internal input signal 212 cycles between the logic function input signals 314a, etc., the internal output signals 318a, 318b, 318c, and 318d may, in turn, become valid or invalid.

In the illustrated embodiment, the RLUT 301 may include a number of output flip-flops (or other memories) configured to latch or store the internal output signal when it includes a valid or selected value, and ignore the internal output signal when it includes an invalid value. For example, when logic function A is selected the flip-flop 307a may store the internal output signal 318a, and then present correct or valid output values (via the external output signal 316a) for the rest of the external clock cycle. Likewise with flip-flops 307b, 307c, and 307d.

In various embodiments, the RLUT 301 may include control circuitry or logic function selector 320 to enable the flip-flops 307a, etc. during the appropriate selection period. For example, if the selection period is uniform and merely rotates, the enable signals (not shown) may have a period equal to the external clock, but a duty cycle of 25%, and be appropriately staggered. Conversely, if the selection scheme was more complex the enable signal may more closely equal the selection signal 310. It is understood that the above are merely a few illustrative examples to which the disclosed subject matter is not limited.

Figure 3C:
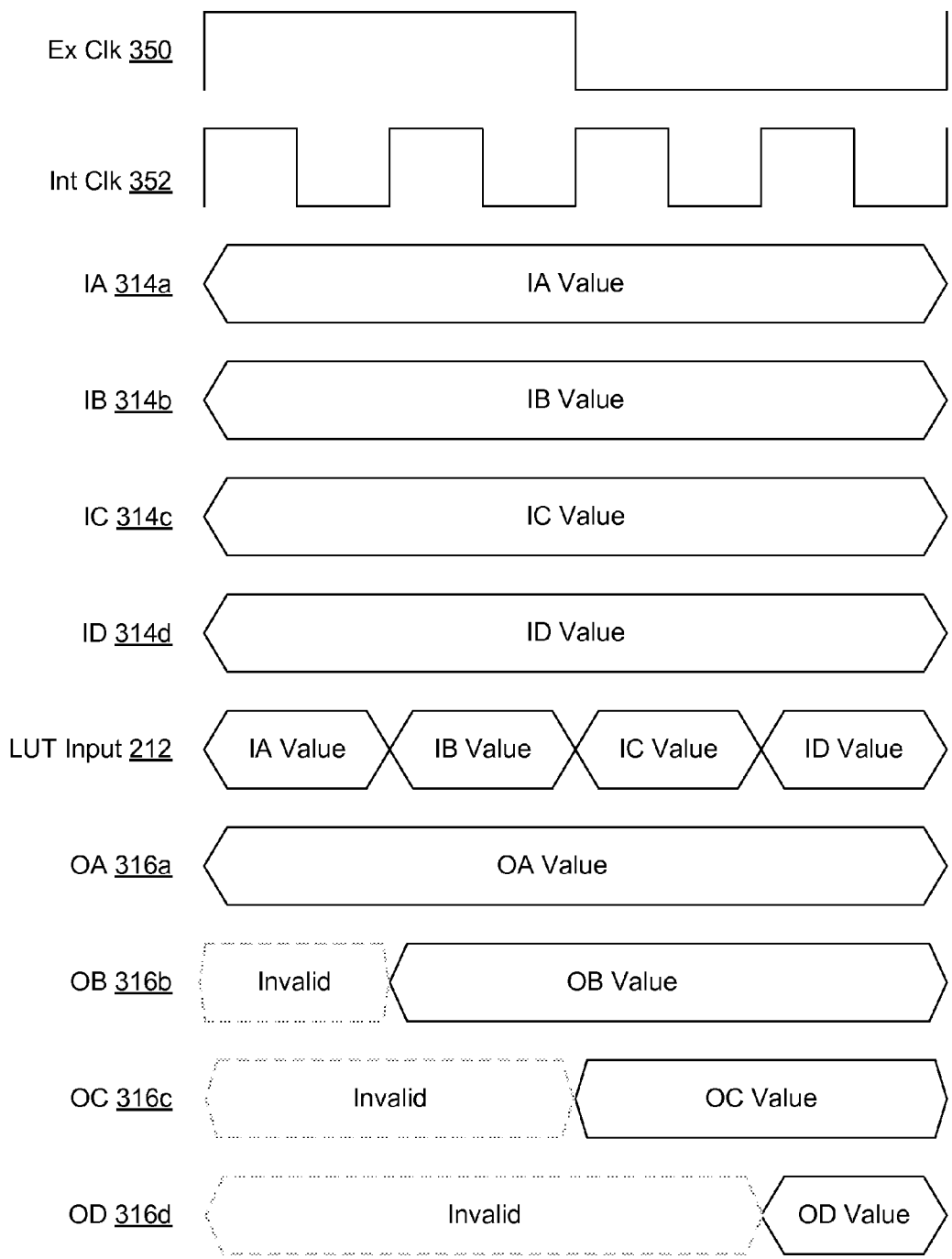

FIG. 3c is a timing diagram 303 of an example embodiment of an apparatus or RLUT in accordance with the disclosed subject matter. In one embodiment, the timing diagram 303 may illustrate an example signal timing diagram of the RLUT 301 of FIG. 3b. It is understood that the above is merely one illustrative example to which the disclosed subject matter is not limited.

In the illustrated embodiment, there may be an external clock 350 and an internal clock 352. As shown, in one embodiment, the internal clock 352 may operate at four times the frequency or speed of the external clock 350. While this may be convenient if four logic functions are stored in the RLUT, there need not be a relationship between the number of stored logic functions and the ratio of the two clocks 350 and 352. If less logic functions are stored, then some output signals (e.g., output signal 316d, etc.) may always be invalid. If more logic functions are stored than the clock ratio (e.g., a fifth logic function E is stored and the ratio is only 1:4), then the association between the input/output signals and the logic functions may not be fixed. For example, during a first external clock cycle the output signal 316a may be associated with logic function A, and during a second external clock cycle the output signal 316a may be associated with logic function E. It is understood that the above is merely one illustrative example to which the disclosed subject matter is not limited.

As described above, the input signals 314a, 314b, 314c, and 314d, may change on the rising edge of the external clock 350. In such an embodiment, the inputs may include valid values for the various logic functions A, B, C, and D. In some embodiments, the logic function input values may only be valid during part of the external clock 350's cycle, but that is not shown.

As described above, the selection signal (not shown in FIG. 3c) may select each logic function, in turn. In such an embodiment, the logic function or external inputs signals 314a, 314b, 314c, and 314d may be passed or selected to be the internal or LUT input signal 212, in turn. In the illustrated embodiment, this is shown by the value of the LUT input signal 212 changing on the rising edge of the internal clock 352.

As described above, the RLUT may include flip-flops or other memories that latch or store the output signals and hold them steady during the rising edge of the external clock 350. In the illustrated embodiment, the output signals (e.g., Output A 316a, etc.) are shown being latched or becoming valid as the RLUT input selects their respective logic functions.

In the illustrated embodiment, the processing delay between the inputs (e.g., LUT input 212) and the outputs (e.g., OA 316a, etc.) is omitted for simplicity's sake. For example, the flip-flops may be configured to store the outputs on the falling edges of the internal clock 352, if half an internal clock cycle is sufficient processing time. It is understood that the above is merely one illustrative example to which the disclosed subject matter is not limited. In the illustrated embodiment, the values of the outputs prior to their respective logic function's selection is shown as being invalid. However, in various embodiments, the value may be that of the output from the previous external clock cycle. Again, it is understood that the above is merely one illustrative example to which the disclosed subject matter is not limited.

Figure 4:
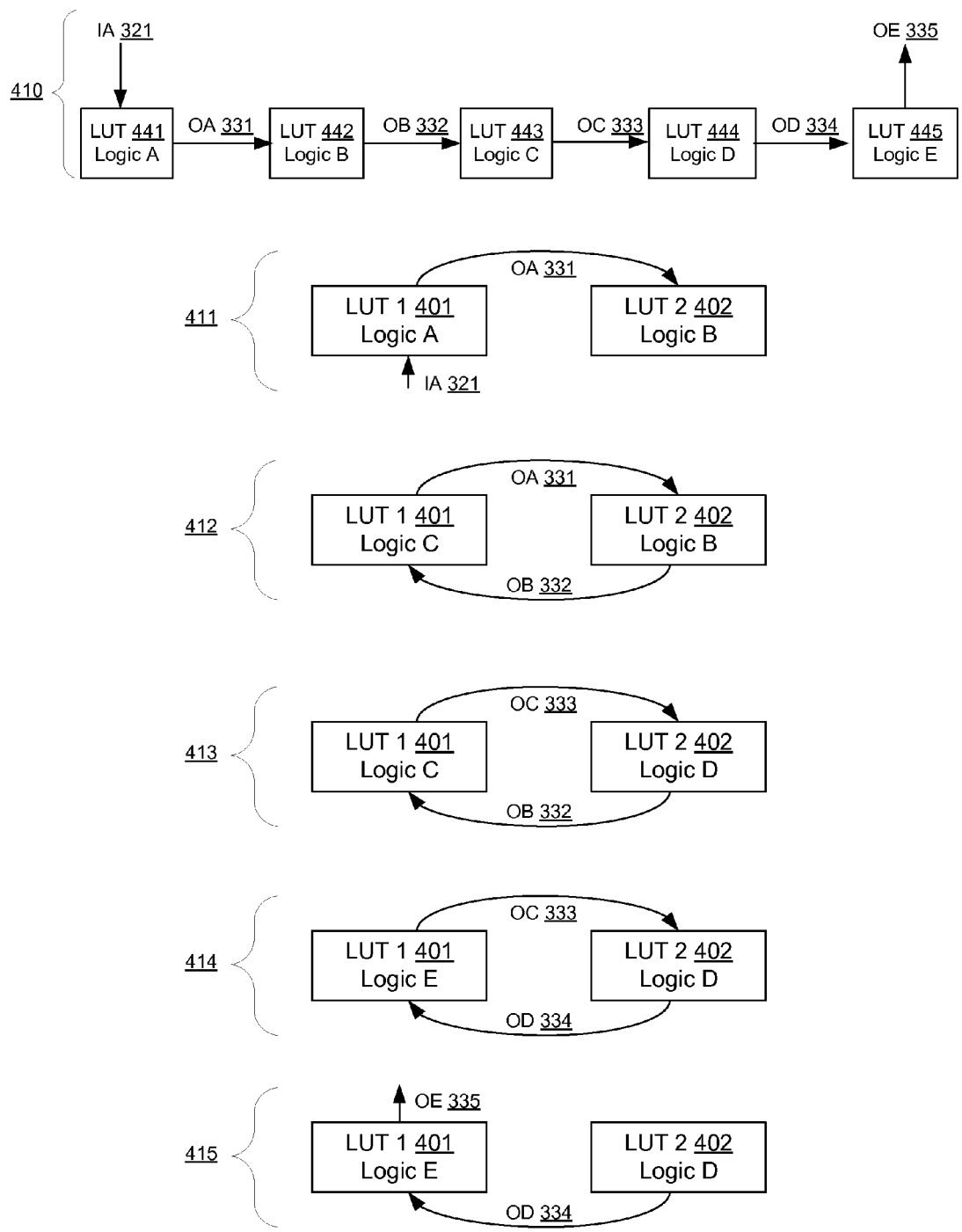

FIG. 4 is a block diagram of an example embodiment of a system 400 in accordance with the disclosed subject matter. In the illustrated embodiment, a plurality of (e.g., two, etc.) RLUTs are employed to create a pipelined processing system. In such an embodiment, this pipelined system is created by multiplexing between logic functions stored within the plurality of RLUTs.

Diagram 410 shows how a traditional pipelined architecture can be implemented using a plurality of RLUTs (e.g., five, etc.) where each RLUT is associated with only one logic function (for at least the purposes of this example). In the illustrated embodiment, the pipeline includes five stages, and therefore includes five RLUTs 441, 442, 443, 444, and 445. Each RLUT stores LUTs for the logic functions A, B, C, D, and E, respectively.

The primary input to the pipeline is input A 321. RLUT 441 executes logic function A, and (based on the input A 321) outputs A 331. This is passed to the next RLUT, RLUT 442, which executes the next pipe stage, logic function B, and outputs B 332. Again, this is passed to the next RLUT, RLUT 443, which executes the next pipe stage, logic function C, and outputs C 333. And again, this is passed to the next RLUT, RLUT 444, which executes the next pipe stage, logic function D, and outputs D 334. Finally, this is passed to the last RLUT, RLUT 445, which executes the last pipe stage, logic function E, and outputs E 335. Output E 335 is the final output of the pipeline. In such an embodiment, an implementation of the pipeline includes five RLUTs. If the LUTs of the logic functions are relatively small, the storage efficiency may be fairly low.

In the illustrated embodiment, the system 400 may include two RLUTs 401 and 402. In such an embodiment, each RLUT 401 and 402 may be programmed or store LUTs corresponding to a plurality of logic functions. For example, a first RLUT 401 may store LUTs associated with logic functions A, C, and E. Whereas, a second RLUT 402 may store LUTs associated with logic functions B, and D. It is understood that the above is merely one illustrative example to which the disclosed subject matter is not limited.

In the illustrated embodiment, instead of employing a single RLUT for each pipe stage, the system 400 may employ fewer RLUTs by storing multiple logic function LUTs in each RLUT and then multiplexing between them. As such, the diagrams 411, 412, 413, 414, and 415 show a series of clock cycles or events in time, as the two RLUTs 401 and 402 multiplex between the various logic functions and simulate the pipeline architecture of diagram 410. However, the multiplexing pipeline architecture may accomplish the processing between input A 312 and output E 335 with less hardware and more storage efficiency than the flat pipeline architecture of diagram 410. It is understood that the above is merely one illustrative example to which the disclosed subject matter is not limited.

In the first stage of the pipeline, time or diagram 411 shows that the RLUT 401 has logic function A selected, as input A 321 is input into it. The RLUT 401 processes the input A 321, according to logic function A, and generates the output A 331. This is then routed as the input into RLUT 402.

In the second stage of the pipeline, time or diagram 412 shows that the RLUT 402 has logic function B selected, as input (previously output) A 331 is input into it. The RLUT 402 processes the input B 331, according to logic function B, and generates the output B 332. This is then routed as the input into RLUT 401.

In the third stage of the pipeline, time or diagram 413 shows that the RLUT 401 has logic function C selected, as input (previously output) C 332 is input into it. The RLUT 401 processes the input C 332, according to logic function C, and generates the output C 333. This is then routed as the input into RLUT 402.

In the fourth stage of the pipeline, time or diagram 414 shows that the RLUT 402 has logic function D selected, as input (previously output) C 332 is input into it. The RLUT 402 processes the input C 332, according to logic function D, and generates the output D 334. This is then routed as the input into RLUT 401.

In the fifth and final stage of the pipeline, time or diagram 415 shows that the RLUT 401 has logic function E selected, as input (previously output) D 334 is input into it. The RLUT 401 processes the input D 334, according to logic function D, and generates the output E 335. This is then output as the end result of the pipeline.

In various embodiments, pipeline architectures may be implemented using any number of RLUTs. For example, the time multiplexing capabilities of the RLUT of FIG. 3a or 3b may be employed to allow a single RLUT to act as a pipelined system. In another embodiment, three or more RLUTs may be used.

In various embodiments, a pipelined system of RLUTs may allow branching architectures. For example, the logic functions may change based upon the processing needed. In a specific example, if the pipeline processes Internet packets, a virtual private network (VPN) processing stage or logic function may be added or omitted from the pipeline depending on whether the processed Internet packet includes a VPN header. It is understood that the above are merely a few illustrative examples to which the disclosed subject matter is not limited.

In another embodiment, the time multiplexing capabilities of the RLUT of FIG. 3a or 3b may be employed to allow the system 400 to process multiple instructions substantially simultaneously. For example, a traditional pipeline normally staggers the processing of instructions such that multiple instructions are being processed (in various stages) simultaneously. If, in one embodiment, the system 400 includes the time multiplexing to execute three logic functions per external clock cycle, up to three separate instructions may be simultaneously processed by the system 400. For example, a first instruction could be executed by RLUT 401 using logic function A, while a second instruction could be executed by RLUT 401 using logic function C, and a third using logic function E.

In various embodiments, even greater efficiencies could be achieved if the RLUTs 401 and 402 where both capable of executing logic functions A, B, C, D, and E. In such an embodiment, the RLUTs could flip between the "first" and "second" RLUT shown in FIG. 4 to allow two parallel streams of instructions. For example, both RLUTs 401 and 402 could have logic function A selected. RLUT 401 could process a first instruction (as shown in FIG. 4) and RLUT 402 could process a second instruction (imagine a version of FIG. 4 were RLUT 402 is LUT 1). They could then both select logic function B, and process the opposite instruction (the first instruction experiencing the path shown in FIG. 4, the second instruction experiencing a mirrored version of FIG. 4). This may continue until the pipeline processing is finished.

In various embodiments, the above variations on the pipeline architecture may be combined as desired. It is understood that the above are merely a few illustrative examples to which the disclosed subject matter is not limited.

Figure 5:
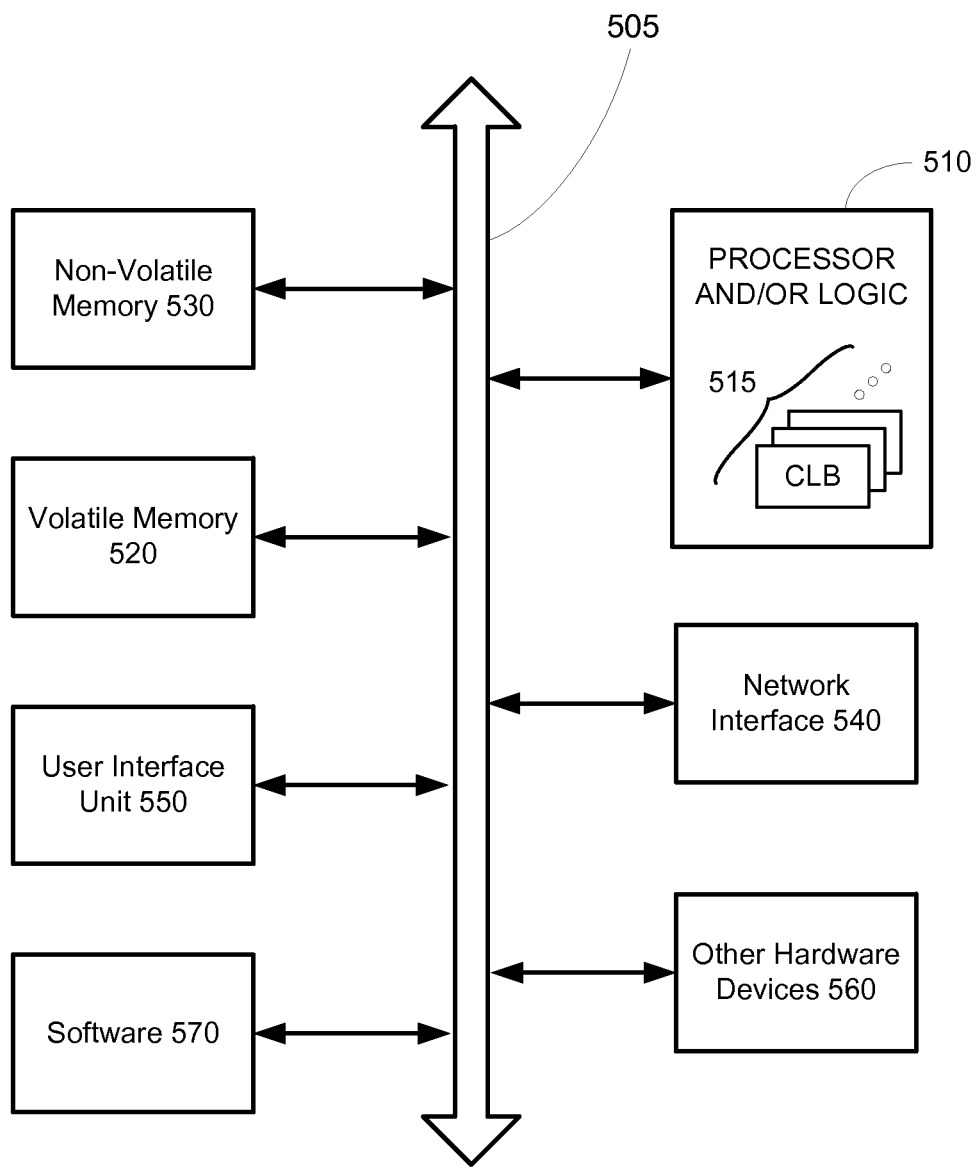

FIG. 5 is a schematic block diagram of an information processing system 500, which may include semiconductor devices formed according to principles of the disclosed subject matter.

Referring to FIG. 5, an information processing system 500 may include one or more of devices constructed according to the principles of the disclosed subject matter. In another embodiment, the information processing system 500 may employ or execute one or more techniques according to the principles of the disclosed subject matter.

In various embodiments, the information processing system 500 may include a computing device, such as, for example, a laptop, desktop, workstation, server, blade server, personal digital assistant, smartphone, tablet, and other appropriate computers, etc. or a virtual machine or virtual computing device thereof. In various embodiments, the information processing system 500 may be used by a user (not shown).

The information processing system 500 according to the disclosed subject matter may further include a central processing unit (CPU), logic, or processor 510. In some embodiments, the processor 510 may include one or more functional unit blocks (FUBs) or combinational logic blocks (CLBs) 515. In such an embodiment, a combinational logic block may include various Boolean logic operations (e.g., NAND, NOR, NOT, XOR, etc.), stabilizing logic devices (e.g., flip-flops, latches, etc.), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 500 according to the disclosed subject matter may further include a volatile memory 520 (e.g., a Random Access Memory (RAM), etc.). The information processing system 500 according to the disclosed subject matter may further include a non-volatile memory 530 (e.g., a hard drive, an optical memory, a NAND or Flash memory, etc.). In some embodiments, either the volatile memory 520, the non-volatile memory 530, or a combination or portions thereof may be referred to as a "storage medium". In various embodiments, the volatile memory 520 and/or the non-volatile memory 530 may be configured to store data in a semi-permanent or substantially permanent form.

In various embodiments, the information processing system 500 may include one or more network interfaces 540 configured to allow the information processing system 500 to be part of and communicate via a communications network. Examples of a Wi-Fi protocol may include, but are not limited to, Institute of Electrical and Electronics Engineers (IEEE) 802.11g, IEEE 802.11n, etc. Examples of a cellular protocol may include, but are not limited to: IEEE 802.16m (a.k.a. Wireless-MAN (Metropolitan Area Network) Advanced), Long Term Evolution (LTE) Advanced), Enhanced Data rates for GSM (Global System for Mobile Communications) Evolution (EDGE), Evolved High-Speed Packet Access (HSPA+), etc. Examples of a wired protocol may include, but are not limited to, IEEE 802.3 (a.k.a. Ethernet), Fibre Channel, Power Line communication (e.g., HomePlug, IEEE 1901, etc.), etc. It is understood that the above are merely a few illustrative examples to which the disclosed subject matter is not limited.

The information processing system 500 according to the disclosed subject matter may further include a user interface unit 550 (e.g., a display adapter, a haptic interface, a human interface device, etc.). In various embodiments, this user interface unit 550 may be configured to either receive input from a user and/or provide output to a user. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

In various embodiments, the information processing system 500 may include one or more other devices or hardware components 560 (e.g., a display or monitor, a keyboard, a mouse, a camera, a fingerprint reader, a video processor, etc.). It is understood that the above are merely a few illustrative examples to which the disclosed subject matter is not limited.

The information processing system 500 according to the disclosed subject matter may further include one or more system buses 505. In such an embodiment, the system bus 505 may be configured to communicatively couple the processor 510, the volatile memory 520, the non-volatile memory 530, the network interface 540, the user interface unit 550, and one or more hardware components 560. Data processed by the processor 510 or data inputted from outside of the non-volatile memory 530 may be stored in either the non-volatile memory 530 or the volatile memory 520.

In various embodiments, the information processing system 500 may include or execute one or more software components 570. In some embodiments, the software components 570 may include an operating system (OS) and/or an application. In some embodiments, the OS may be configured to provide one or more services to an application and manage or act as an intermediary between the application and the various hardware components (e.g., the processor 510, a network interface 540, etc.) of the information processing system 500. In such an embodiment, the information processing system 500 may include one or more native applications, which may be installed locally (e.g., within the non-volatile memory 530, etc.) and configured to be executed directly by the processor 510 and directly interact with the OS. In such an embodiment, the native applications may include pre-compiled machine executable code. In some embodiments, the native applications may include a script interpreter (e.g., C shell (csh), AppleScript, AutoHotkey, etc.) or a virtual execution machine (VM) (e.g., the Java Virtual Machine, the Microsoft Common Language Runtime, etc.) that are configured to translate source or object code into executable code which is then executed by the processor 510.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive, etc.). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
   a random access memory array comprising a reconfigurable look-up table, wherein the reconfigurable look-up table comprises:
      memory cells configured to simultaneously store a plurality of look-up tables, wherein each look-up table is associated with a respective logic function, and
      a local row decoder configured to activate one or more rows of memory cells based upon a set of input signals;
   wherein the reconfigurable look-up table is configured to execute one or more dynamically selected logic function at a time; and
   wherein the plurality of look up tables stored in the memory cells is configured to be dynamically altered via a write operation to the random access memory array.

2. The apparatus of claim 1, wherein a subset of the set of input signals is active based upon which logic function is selected.

3. The apparatus of claim 1, wherein the reconfigurable look-up table includes an input decoder configured to route the one or more of set of inputs to the local row decoder based upon which logic function is selected.

4. The apparatus of claim 1, wherein the reconfigurable look-up table includes an internal clock signal and an external clock signal; and
   wherein a number of the plurality of look-up tables stored by the memory cells is associated with the ratio of a frequency of the internal clock signal to a frequency of the external clock signal.

5. The apparatus of claim 1, wherein the reconfigurable look-up table is configured to time-division multiplex between the plurality of look-up tables.

6. The apparatus of claim 1, wherein the random access memory array comprises at least two reconfigurable look-up tables, each reconfigurable look-up table storing respective one or more look-up tables, wherein each look-up table is associated with a respective logic function;
   wherein the at least two reconfigurable look-up tables are electrically coupled such that an output of one of the two reconfigurable look-up tables is the input to the other reconfigurable look-up table; and
   wherein the at least two reconfigurable look-up tables are configured to cycle through their respective logic functions in order to perform a pipelined logic operation.

7. The apparatus of claim 1, wherein the reconfigurable look-up table comprises an output selector configured to select between a plurality of sets of output signals based upon a selected logic function; and
   wherein each set of output signals is associated with a respective one of the look-up tables.

8. The apparatus of claim 1, wherein the reconfigurable look-up table includes a first minimum number of input signals, and a first minimum number of output signals;
   wherein each logic function includes a second minimum number of input signals, and a second minimum number of output signals;
   wherein the second minimum number of input signals is less than or equal to the first minimum number of input signals; and
   wherein the second minimum number of output signals is less than or equal to the first minimum number of output signals.

9. The apparatus of claim 1, wherein the reconfigurable look-up table includes a logic function selector configured to:
   automatically select one of the respective logic functions to perform,
   based upon a selected logic function, select a set of input signals to be employed by the local row decoder,
   based upon the selected logic function, select a set out output signals to be output by the reconfigurable look-up table.

10. A system-on-a-chip comprising:
   a random access memory array comprising a reconfigurable look-up table, wherein the reconfigurable look-up table comprises:
      memory cells configured to simultaneously store a plurality of look-up tables, wherein each look-up table is associated with a respective logic function, and
      a logic function selector configured to dynamically select one the of plurality of look-up tables to be active;
   wherein the reconfigurable look-up table is configured to perform the selected logic function; and
   a processor configured to off-load an execution of at least the selected logic function to the reconfigurable look-up table.

11. The system-on-a-chip of claim 10, wherein the processor is configured to off-load an execution of a series of logic functions to the reconfigurable look-up table, wherein each of the series of logic functions is associated with a look-up table stored by the reconfigurable look-up table; and
   wherein the reconfigurable look-up table is configured to dynamically switch a selection of an active logic function to execute each of the series of logic functions in turn.

12. The system-on-a-chip of claim 10, wherein the processor is configured to off-load an execution a plurality of logic functions to the reconfigurable look-up table, wherein each of the plurality of logic functions is associated with a look-up table stored by the reconfigurable look-up table; and
   wherein the reconfigurable look-up table includes:
      an internal clock signal that operates at a multiple of an external clock signal, and
      wherein the reconfigurable look-up table is configured to, according to the internal clock signal, dynamically select and execute the plurality of logic functions within a period of the external clock signal.

13. The system-on-a-chip of claim 10, wherein the processor is configured to off-load an execution of a plurality of logic functions to the reconfigurable look-up table, wherein each of the plurality of logic functions is associated with a look-up table stored by the reconfigurable look-up table; and
   wherein the reconfigurable look-up table is configured to execute at least two of the plurality of logic functions per clock cycle by multiplexing.

14. The system-on-a-chip of claim 10, wherein the reconfigurable look-up table is configured to time-division multiplex between the plurality of look-up tables.

15. The system-on-a-chip of claim 10, wherein the random access memory array comprises at least a first reconfigurable look-up table and a second reconfigurable look-up table, each reconfigurable look-up table storing respective one or more of look-up tables, wherein each look-up table is associated with a respective logic function;
   wherein the at least two reconfigurable look-up tables are electrically coupled such that an output of the first reconfigurable look-up table is an input to the second reconfigurable look-up table; and
   wherein the first reconfigurable look-up table and the second reconfigurable look-up table are configured to cycle through their respective logic functions in order to perform a pipelined logic operation.

16. The system-on-a-chip of claim 10, wherein the reconfigurable look-up table includes a logic function selector configured to:
   automatically select one of the respective logic functions to perform,
   based upon a selected logic function, select a set of input signals to be employed by a local row decoder,
   based upon the selected logic function, select a set out output signals to be output by the reconfigurable look-up table.

17. The system-on-a-chip of claim 10, wherein the processor is configured to off-load an execution or at least the selected logic function to the reconfigurable look-up table by performing a write operation to the memory array; and
   wherein the processor is configured to receive a result of the at least the selected logic function from the reconfigurable look-up table by performing a read operation to the memory array.

18. A method comprising:
  storing a plurality of look-up tables in a sub-array of a reconfigurable look-up table of a dynamic random access memory array; and
  dynamically multiplexing between at least a sub-set of the plurality of look-up tables to perform a plurality of logic functions, without altering the plurality of look-up tables stored in the reconfigurable look-up table.

19. The method of claim 18, wherein dynamically multiplexing comprises:
  operating an internal clock at a multiple frequency of an external clock; and
  dynamically switching, according to at least the internal clock, between the sub-set of the plurality of look-up tables to perform a plurality of logic functions within a period of the external clock.

20. The method of claim 18, wherein storing a plurality of look-up tables in a sub-array of a reconfigurable look-up table of a dynamic random access memory array comprises storing one or more look-up tables in a first sub-array of a first reconfigurable look-up table of the dynamic random access memory array; and
  the method further comprising:
    storing one or more look-up tables in a second sub-array of a second reconfigurable look-up table of the dynamic random access memory array,
    coupling the first reconfigurable look-up table and the second reconfigurable look-up table such that an output of the first reconfigurable look-up table is an input to second reconfigurable look-up table and vice versa, and
    simulating a pipelined architecture by dynamically switching, according to a predefined pattern, between the first plurality of look-up tables and switching, according to the predefined pattern, between the second plurality of look-up tables.

\* \* \* \* \*